United States Patent
Ju et al.

(10) Patent No.: US 9,648,144 B2
(45) Date of Patent: May 9, 2017

(54) DATA COMPRESSION METHOD AND DECOMPRESSION METHOD

(71) Applicant: MediaTek Inc., Hsin-Chu (TW)

(72) Inventors: Chi-Cheng Ju, Hsinchu (TW); Chia-Yun Cheng, Zhubei (TW); Yung-Chang Chang, New Taipei (TW); Chih-Ming Wang, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 51 days.

(21) Appl. No.: 14/546,213

(22) Filed: Nov. 18, 2014

(65) Prior Publication Data

US 2015/0215432 A1  Jul. 30, 2015

Related U.S. Application Data

(60) Provisional application No. 61/931,096, filed on Jan. 24, 2014.

(51) Int. Cl.
*H04L 29/06* (2006.01)
*H03M 7/30* (2006.01)

(52) U.S. Cl.
CPC .......... *H04L 69/04* (2013.01); *H03M 7/3059* (2013.01); *H04L 69/22* (2013.01)

(58) Field of Classification Search
CPC ........ H03M 7/30; H03M 7/60; H03M 7/3059; H03M 7/6005; H03M 7/6011; H04B 1/66; H04L 67/2828; H04L 69/04; H04L 69/22
USPC ............................................ 375/240; 341/50
See application file for complete search history.

(56) References Cited

U.S. PATENT DOCUMENTS

| | | | | |
|---|---|---|---|---|
| 5,602,550 A | * | 2/1997 | Stein | G06T 9/005 341/60 |
| 6,611,213 B1 | * | 8/2003 | Bentley | G06T 9/005 341/50 |
| 2006/0221959 A1 | * | 10/2006 | Sumiyoshi | H03M 7/30 370/389 |
| 2007/0067326 A1 | * | 3/2007 | Morris | H03M 7/30 |
| 2009/0175360 A1 | * | 7/2009 | Soni | H03M 7/30 375/241 |

OTHER PUBLICATIONS

"Series H: Audiovisual and Multimedia Systems Infrastructure of audiovisual services —Coding of moving video; High efficiency video coding"; ITU-T H.265; Apr. 2013; pp. 1-317.

(Continued)

*Primary Examiner* — Betsy Deppe
(74) *Attorney, Agent, or Firm* — McClure, Qualey & Rodack, LLP

(57) ABSTRACT

A transmitter device includes a processing unit and a compression unit. The processing unit obtains a branch of data and partitions the branch of data into a plurality of snippets. Each snippet includes a group of data. The compression unit compresses each snippet into a plurality of packets according to value of each datum included in the corresponding snippet. The compression unit compares the value of each datum with a first threshold value to generate a first packet. The first packet includes first information indicating which data included in the corresponding snippet has the corresponding value not equal to the first threshold value. The compression unit further generates the remaining packets according to the first information.

25 Claims, 3 Drawing Sheets

(56) References Cited

OTHER PUBLICATIONS

"Series H: Audiovisual and Multimedia Systems Infrastructure of audiovisual services —Coding of moving video; Advanced video coding for generic audiovisual services"; ITU-T H.264; Apr. 2013; pp. 1-732.

* cited by examiner

DATA COMPRESSION METHOD AND DECOMPRESSION METHOD

CROSS REFERENCE TO RELATED APPLICATIONS

This application claims the benefit of U.S. Provisional Application No. 61/931,096 filed 2014 Jan. 24 and entitled "Information transmission and receiving system", the entirety of which is incorporated by reference herein.

BACKGROUND OF THE INVENTION

Field of the Invention

The invention relates to data compression method and decompression methods.

Description of the Related Art

Data compression has held a prominent place in computer science for many years as demand for additional data capacity of various systems increase while storage capacity and bandwidth of such systems are limited. Data compression generally falls into one of two categories: lossy and lossless. In lossy data compression, particularly high rates of data compression are achieved at the expense of distortion of the data. Such is sometimes acceptable for image, video and audio data since small distortions may be only slightly perceptible by a human viewer or listener of the subsequently decompressed data. However, in a number of applications, such distortion of the compressed data is unacceptable.

Lossless data compression reduces the size of the overall representation of data without any distortion of the data at all, i.e., without any loss of data. Lossless data compression is used primarily for compression of text, computer programs, and databases where faithful reproduction of the compressed data is essential.

BRIEF SUMMARY OF THE INVENTION

A transmitter device, a receiver device, a data compression method and a data decompression method are provided. An exemplary embodiment of a transmitter device comprises a processing unit and a compression unit. The processing unit obtains a branch of data and partitions the branch of data into a plurality of snippets. Each snippet comprises a group of data. The compression unit compresses each snippet into a plurality of packets according to value of each datum comprised in the corresponding snippet. The compression unit compares the value of each datum with a first threshold value to generate a first packet. The first packet comprises first information indicating which data comprised in the corresponding snippet has the corresponding value not equal to the first threshold value. The compression unit further selects all or part of the data indicated by the first information according to second information, and compares the value of each datum selected according to the second information with a second threshold value to generate a second packet. The second packet comprises third information indicating which of the data selected according to the second information has the corresponding value greater than the second threshold value. The second information relates to a third threshold value. The compression unit further selects all or part of the data indicated by the third information according to fourth information, and compares the value of each datum selected according to the fourth information with a fourth threshold value to generate a third packet. The third packet comprises fifth information indicating which of the data selected according to the fourth information has the corresponding value greater than the fourth threshold value. The compression unit further generates a fourth packet comprising sixth information indicating whether the data indicated by the first information is greater than zero or smaller than zero.

An exemplary embodiment of a receiver device comprises an input interface and a decompression unit. The receiver device receives a plurality of packets from a transmitter device. The decompression unit decompresses the packets to obtain data comprised in a plurality of snippets. The decompression unit decompresses a first packet to obtain first information, and parses the first information to obtain data comprised in a corresponding snippet having corresponding value that is not equal to a first threshold value. The decompression unit further determines second information according to the first information, decompresses a second packet to obtain third information, and parses the third information to obtain data selected according to the second information and having the corresponding value greater than a second threshold value. The second information relates to a third threshold value. The decompression unit further determines fourth information according to the third information, decompresses a third packet to obtain fifth information, and parses the fifth information to obtain data selected according to the fourth information and having the corresponding value greater than a fourth threshold value. The fourth information relates to a fifth threshold value. The decompression unit further decompresses a fourth packet to obtain sixth information, parses the sixth information to obtain a sign of the data indicated by the first information, and determines the corresponding value of all or part of the data comprised in the corresponding snippet according to the first threshold value, the second threshold value, the fourth threshold value and the sign.

An exemplary embodiment of a data compression method comprises: obtaining a branch of data and partitioning the branch of data into a plurality of snippets, wherein each snippet comprises a group of data; and compressing each snippet into a plurality of packets according to value of each datum comprised in the corresponding snippet. The step of compressing each snippet further comprises: comparing the value of each datum with a first threshold value to generate a first packet, wherein the first packet comprises first information indicating which data comprised in the corresponding snippet has the corresponding value not equal to the first threshold value; selecting all or part of the data indicated by the first information according to second information; comparing the value of each datum selected according to the second information with a second threshold value; generating a second packet comprising third information, wherein the third information indicates which of the data selected according to the second information has the corresponding value greater than the second threshold value, and the second information relates to a third threshold value; selecting all or part of the data indicated by the third information according to fourth information; comparing the value of each datum selected according to the fourth information with a fourth threshold value; generating a third packet comprising fifth information, wherein the fifth information indicates which of the data selected according to the fourth information has the corresponding value greater than the fourth threshold value, and the fourth information relates to a fifth threshold value; and generating a fourth packet comprising sixth information indicating whether the data indicated by the first information is greater than zero or smaller than zero.

An exemplary embodiment of a data decompression method comprises: receiving a plurality of packets; and decompressing the packets to obtain data comprised in a plurality of snippets. The step of decompressing the packets further comprises: decompressing a first packet to obtain first information; parsing the first information to obtain data comprised in a corresponding snippet having corresponding value not equal to a first threshold value; determining second information according to the first information; decompressing a second packet to obtain third information; parsing the third information to obtain data selected according to the second information having the corresponding value greater than a second threshold value, wherein the second information relates to a third threshold value; determining fourth information according to the third information; decompressing a third packet to obtain fifth information; parsing the fifth information to obtain data selected according to the fourth information having the corresponding value greater than a fourth threshold value, wherein the fourth information relates to a fifth threshold value; decompressing a fourth packet to obtain sixth information; and parsing the sixth information to obtain a sign of the data indicated by the first information.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
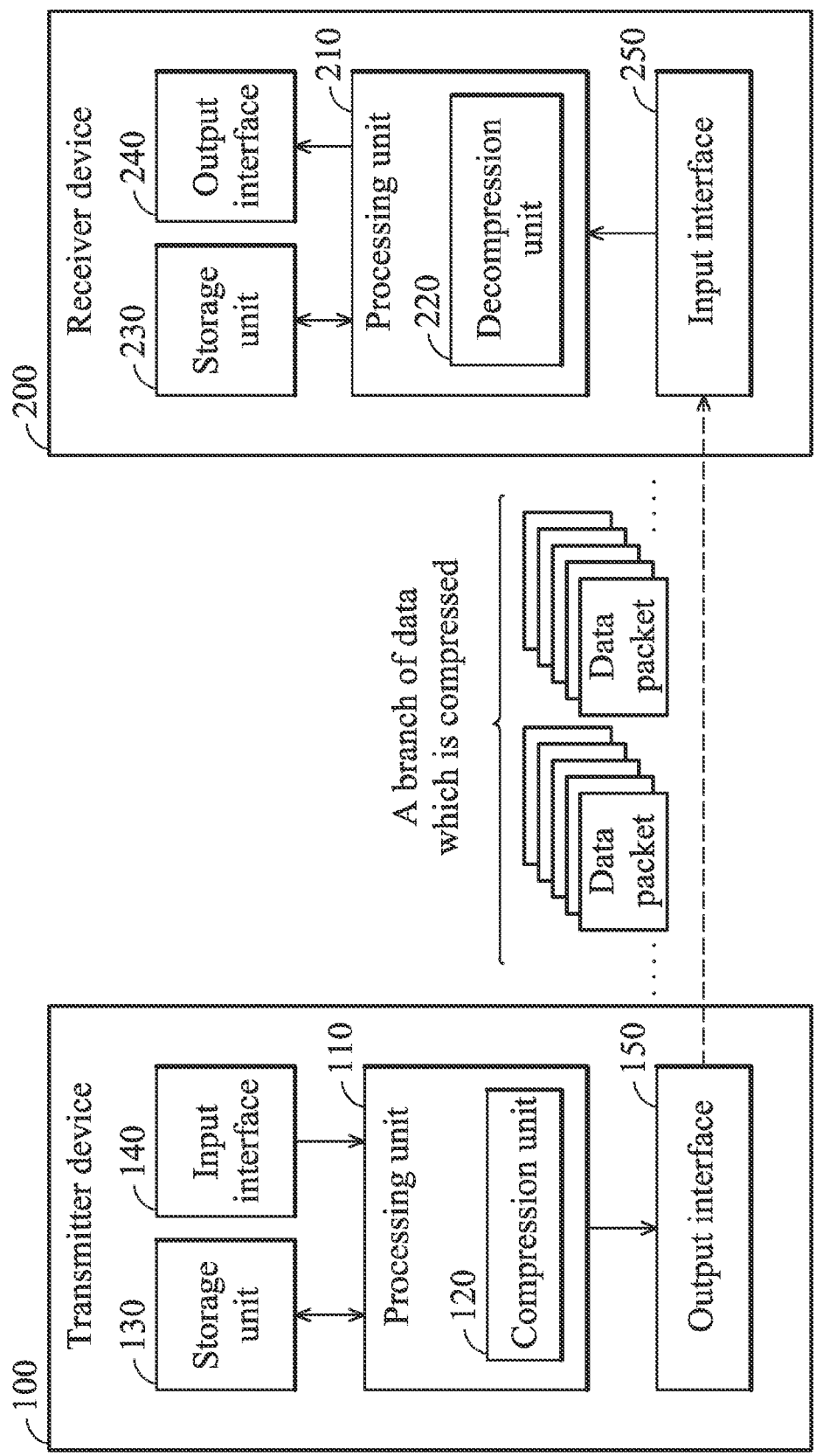
FIG. 1 is a block diagram of a communication system according to an embodiment of the invention.

FIG. 1 is a block diagram of a communication system according to an embodiment of the invention. The communication system may comprise a transmitter device 100 and a receiver device 200. According to an embodiment of the invention, the transmitter device 100 may transmit a branch of compressed data to the receiver device 200. The communication between the transmitter device 100 and the receiver device 200 may be wired or wireless communication.

The transmitter device 100 may comprise a processing unit 110, which may comprise a compression unit 120, a storage unit 130, an input interface 140 and an output interface 150. The processing unit 110 may obtain a branch of data from an external device (not shown) through the input interface 140, or from the source data stored in the storage unit 130, or from another processing unit (not shown) of the transmitter device 100. The processing unit 110 may further partition the branch of data into a plurality of snippets, wherein each snippet comprises a group of data, and the data is arranged in a specific order. The compression unit 120 may compress each snippet into a plurality of packets according to value of each datum comprised in the corresponding snippet. The output interface 150 may transmit the packets corresponding to each snippet to the receiver device 200. According to an embodiment of the invention, the packet transmission order may depend on the importance of the packets. For example, the most important packet of the plurality of packets corresponding to a snippet is transmitted first and the least important packet is transmitted last.

The receiver device 200 may comprise a processing unit 210, which may comprise a decompression unit 220, a storage unit 230, an output interface 240 and an input interface 250. The input interface 250 may receive packets from the transmitter device 100. The processing unit 210 may control the decompressing unit 220 to decompress the packets to obtain data comprised in a plurality of snippets. The decompressed data may be stored in the storage unit 230, output to an external device (not shown) through the output interface 240, output to another unit (not shown) of the receiver device 200, or displayed by the receiver device 200.

Figure 2:
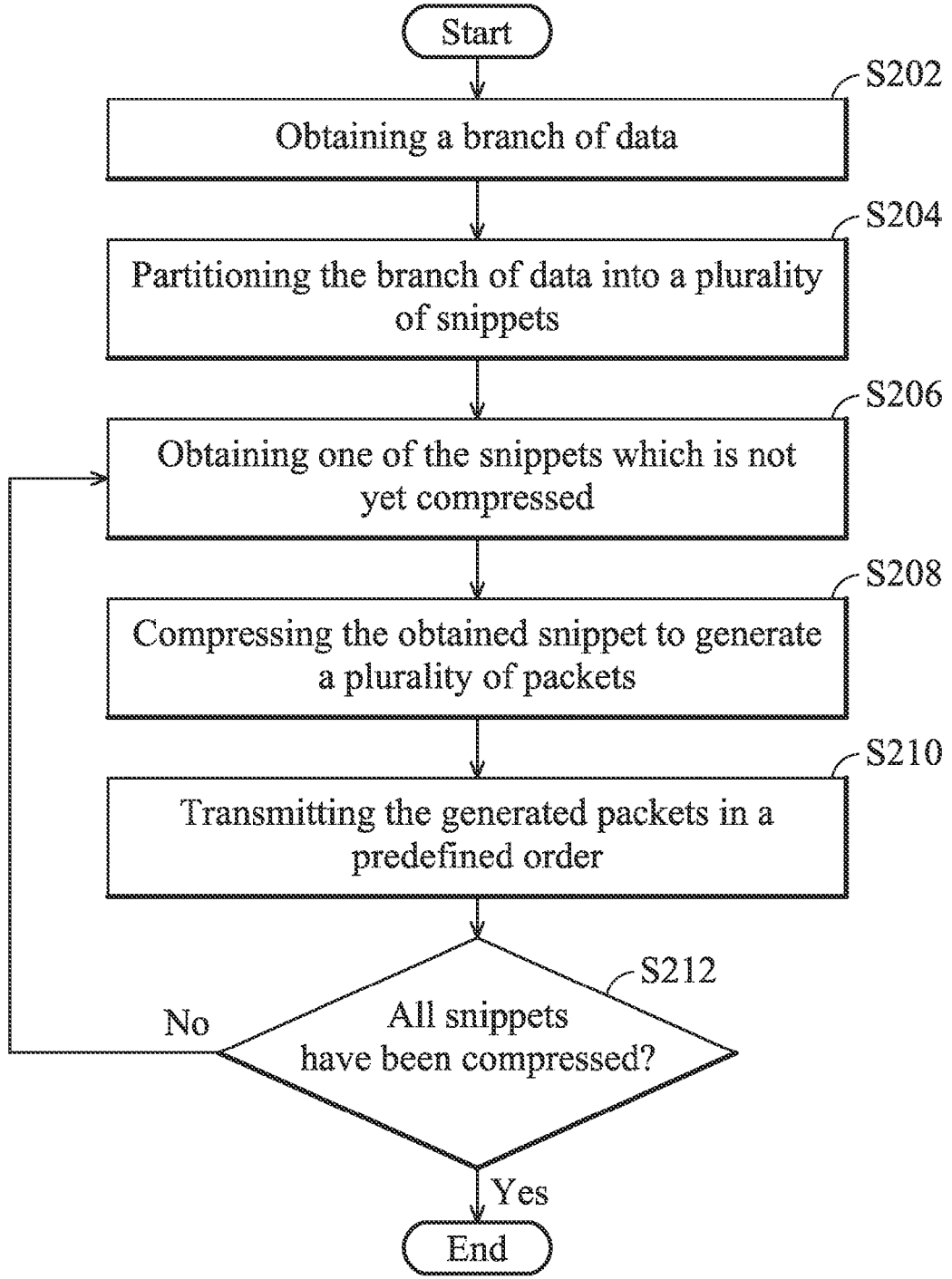
FIG. 2 is a flow chart of a method for processing a branch of data obtained by the transmitter device according to an embodiment of the invention.

FIG. 2 is a flow chart of a method for processing a branch of data obtained by the transmitter device 100 according to an embodiment of the invention. The transmitter device 100 may first obtain a branch of data (Step S202). Next, the transmitter device 100 may partition the branch of data into a plurality of snippets (Step S204). Next, the transmitter device 100 may obtain one of the snippets which is not yet compressed (Step S206). Next, the transmitter device 100 may compress the obtained snippet to generate a plurality of packets (Step S208). Next, the transmitter device 100 may transmit the generated packets in a predefined order (Step S210). In an embodiment of the invention, the order of transmitting the packets follows the order (the predefined order) of generating the packets. Next, the transmitter device 100 may determine whether all snippets have been compressed (Step S212). If yes, the data processing procedure is ended. If no, the procedure returns to Step S206 to process another snippet.

Figure 3:
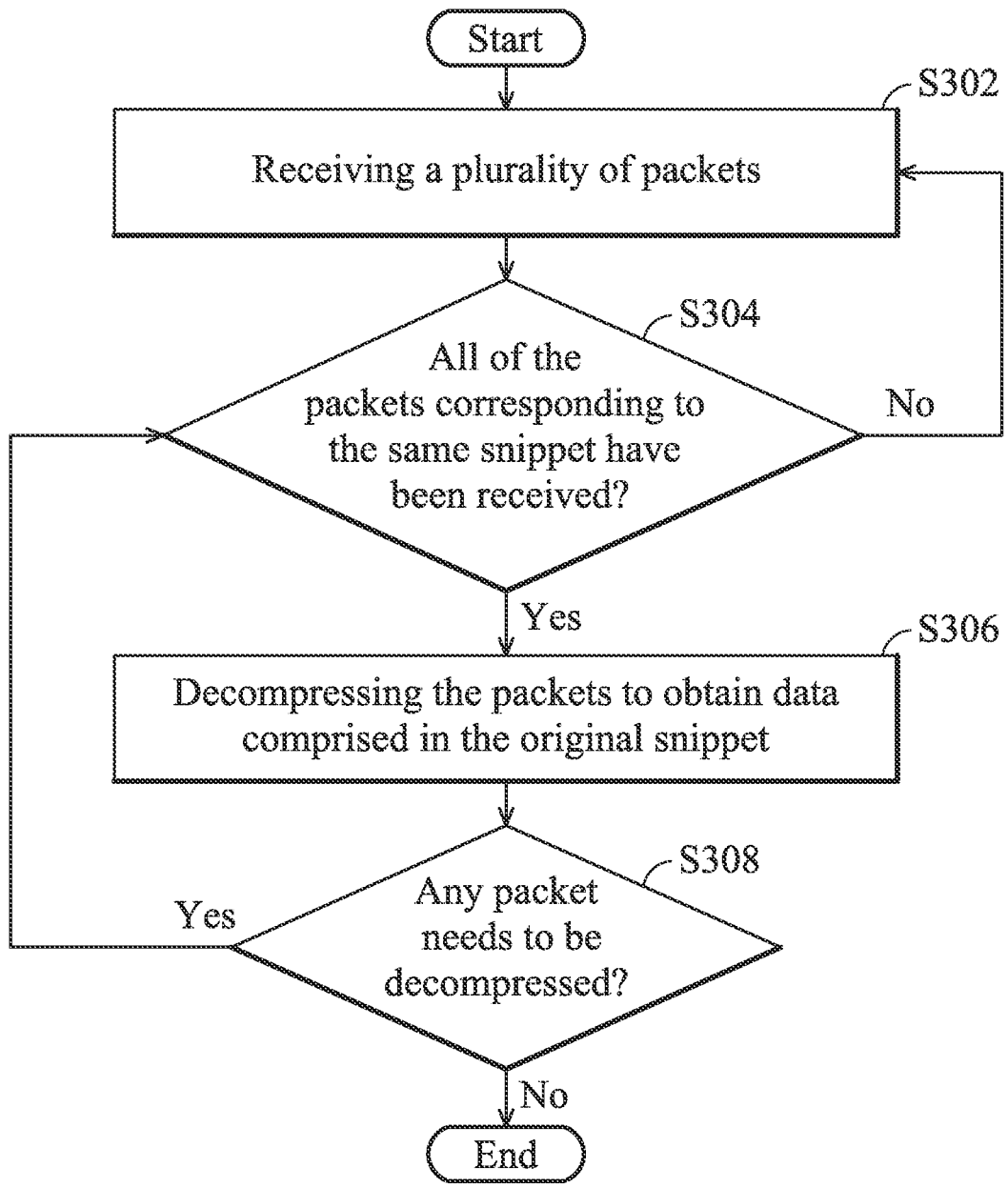
FIG. 3 is a flow chart of a method for processing a plurality of received packets obtained by the receiver device according to an embodiment of the invention.

FIG. 3 is a flow chart of a method for processing a plurality of received packets obtained by the receiver device 200 according to an embodiment of the invention. First of all, the receiver device 200 may receive a plurality of packets from the transmitter device 100 (Step S302). Next, the receiver device 200 may determine whether all of the packets corresponding to the same snippet have been received (Step S304). If no, the procedure returns to step S302 to receive the remaining packets. If yes, the receiver device 200 may decompress the packets to obtain data comprised in the original snippet (Step S306). Next, the receiver device 200 may further determine whether there is any packet that needs to be decompressed (Step S308). If no, the data processing procedure is ended. If yes, the procedure returns to step S304.

According to an embodiment of the invention, the compression unit 120 of the transmitter device 100 may compress each snippet into five packets according to value of each datum comprised in the corresponding snippet. The proposed data compression method and data decompression method are introduced in the following paragraphs.

According to an embodiment of the invention, the compression unit 120 may first compare the value of each datum comprised in the corresponding snippet with a first threshold value TH_1 to generate a first packet Packet_1. The first packet Packet_1 may comprise first information Info_1 indicating which data comprised in the corresponding snippet has the corresponding value not equal to the first threshold value TH_1.

Suppose that the first threshold value TH_1 is equal to 0 and the values of the original data D[0]~D[15] comprised in the corresponding snippet are: {0, 32, 0, 0, −1, 0, 1, 4, −2, 0, 0, −1, 0, 0, 1, −4}. Note that the structure of the data comprised in the corresponding snippet may be a 1D array, a 2D array, a link list, or another format, and the invention should not be limited to any specific case. The first information Info_1 may be represented in a plurality of different forms. Here are some embodiments showing different representative forms of the first information Info_1.

In a first embodiment of the invention, the first information may directly indicate which data comprised in the corresponding snippet has the corresponding value not equal to the first threshold value TH_1. For example, the first information Info_1 is {0, 1, 0, 0, 1, 0, 1, 1, 1, 0, 0, 1, 0, 0, 1, 1}, where 0 represents the data with the value equal to the first threshold value TH_1 and 1 represents the data with the value that is not equal to the first threshold value TH_1. Note that the first information Info_1 may also be encoded further to reduce the data size, and the invention should not be limited thereto.

In a second embodiment of the invention, the first information may indicate the index of the data comprised in the corresponding snippet having the corresponding value not equal to the first threshold value TH_1. For example, the first information Info_1 is {1, 4, 6, 7, 8, 11, 14, 15}. Note that the first information Info_1 may also be encoded further to reduce the data size, and the invention should not be limited thereto. Note further that an indicator eob (end of block) may also be added at the end of the first information Info_1 to indicate that the content of the first information Info_1 is ended.

In a third embodiment of the invention, the first information may be a run length code which indicates the relative position of the data comprised in the corresponding snippet having the corresponding value not equal to the first threshold value TH_1. For example, the first information Info_1 is {1, 2, 1, 0, 0, 2, 2, 0}. Each value in the first information Info_1 represents the amount of data with the value equal to the first threshold value TH_1 and indexed before a datum with the value not equal to the first threshold value TH_1. Note that the first information Info_1 may also be encoded further to reduce the data size, and the invention should not be limited thereto. Note further that an indicator eob (end of block) may also be added at the end of the first information Info_1 to indicate that the content of the first information Info_1 is ended.

Next, the compression unit 120 may further select all or part of the data indicated by the first information Info_1 according to second information Info_2, and compares the value of each datum selected according to the second information Info_2 with a second threshold value TH_2 to generate a second packet Packet_2.

According to an embodiment of the invention, the second information Info_2 relates to the amount of the data indicated by the first information Info_1 and a third threshold value TH_3. For example, the second information Info_2 may indicate whether the amount of the data indicated by the first information Info_1 is greater than the third threshold value TH_3. When the amount of the data indicated by the first information Info_1 is greater than the third threshold value TH_3, the compression unit 120 selects part (for example, only TH_3) of the data indicated by the first information Info_1, and when the data indicated by the first information Info_1 is not greater than the third threshold value TH_3, the compression unit 120 selects all of the data indicated by the first information Info_1. In other words, the second information Info_2 may indicate whether the data indicated by the first information Info_1 is truncated when generating the second packet Packet_2.

The second packet Packet_2 may comprise third information Info_3 indicating which of the data selected according to the second information Info_2 has the corresponding value greater than the second threshold value TH_2.

Suppose that the second threshold value TH_2 is equal to 1 and the third threshold value TH_3 is equal to 6. Since the amount of the data indicated by the first information Info_1 is 8, which is greater than the third threshold value TH_3, the compression unit 120 selects six data out of the eight data indicated by the first information Info_1 from the beginning of the data, that is, D[1], D[4], D[6], D[7], D[8] and D[11], and compares the value of the selected data with the second threshold value TH_2 to generate the second packet Packet_2.

Note that in the embodiments of the invention, when compared with the threshold values, the absolute values of the data comprised in the snippet are used. In addition, the third information Info_3 may be represented in a plurality of different forms. Here are some embodiments showing different representative forms of the third information Info_3.

In another embodiment of the invention, the second information Info_2 is determined only according to the third threshold value TH_3, the third threshold value TH_3 may be one of several predetermined values. For example, if the third threshold value TH_3 is a first predetermined value, the second information Info_2 indicates that all of the data indicated by the first information Info_1 would be selected by the compression unit 120. On the other hand, if the third threshold value TH_3 is a second predetermined value, the second information Info_2 indicates that only a part of the data indicated by the first information Info_1 would be selected by the compression unit 120 (say the first X of data indicated by the first information Info_1, where the number X is an integer). Alternatively, if the third threshold value TH_3 is a third predetermined value, the second information Info_2 indicates that only a part of the data indicated by the first information Info_1 would be selected by the compression unit 120 (say the first Y of data indicated by the first information Info_1, where the number Y is an integer different from X). In this embodiment, the second packet Packet_2 may comprise the second information Info_2 and the third information Info_3. Alternatively, the second information Info_2 may be predefined in both of the transmitter device 100 and the receiver device 200, so there is no need to pack the second information Info_2 into the second packet Packet_2.

Continuing with the first embodiment of the invention, the third information may directly indicate which of the data selected according to the second information Info_2 (that is, the data D[1], D[4], D[6], D[7], D[8] and D[11] in this example) has the corresponding value greater than the second threshold value TH_2. For example, the third information Info_3 is {1, 0, 0, 1, 1, 0}, where 0 represents the data with the value not greater than the second threshold value TH_2 and 1 represent the data with the value greater than the second threshold value TH_2. Note that the third information Info_3 may also be encoded further to reduce the data size, and the invention should not be limited thereto.

Continuing with the second embodiment of the invention, the third information may indicate the index of the data selected according to the second information Info_2 (that is, the data D[1], D[4], D[6], D[7], D[8] and D[11] in this example) having the corresponding value greater than the second threshold value TH_2. For example, the third information Info_3 is {1, 7, 8}. Note that the third information Info_3 may also be encoded further to reduce the data size, and the invention should not be limited thereto. Note further that an indicator eob (end of block) may also be added at the end of the third information Info_3 to indicate that the content of the third information Info_3 is ended.

Continuing with the third embodiment of the invention, the third information may be a run length code which indicates the relative position of the data selected according to the second information Info_2 (that is, the data D[1], D[4], D[6], D[7], D[8] and D[11] in this example) having the corresponding value greater than the second threshold value TH_2. For example, the third information Info_3 is {0, 2, 0}. Each value in the third information Info_3 represents the amount of data with the value not greater than the second threshold value TH_2 and indexed before a datum with the value greater than the second threshold value TH_2. Note that the third information Info_3 may also be encoded further to reduce the data size, and the invention should not be limited thereto. Note further that an indicator eob (end of block) may also be added at the end of the third information Info_3 to indicate that the content of the third information Info_3 is ended.

Next, the compression unit 120 may further select all or part of the data indicated by the third information Info_3 according to fourth information Info_4, and compares the value of each datum selected according to the fourth information Info_4 with a fourth threshold value TH_4 to generate a third packet Packet_3.

According to an embodiment of the invention, the fourth information Info_4 relates to the amount of the data indicated by the third information Info_3 and a fifth threshold value TH_5. For example, the fourth information Info_4 indicates whether the amount of the data indicated by the third information Info_3 is greater than the fifth threshold value TH_5. When the amount of the data indicated by the third information Info_3 is greater than the fifth threshold value TH_5, the compression unit 120 selects part (for example, only TH_5) of the data indicated by the third information Info_3, and when the data indicated by the third information Info_3 is not greater than the fifth threshold value TH_5, the compression unit 120 selects all of the data indicated by the third information Info_3. In other words, the fourth information Info_4 may indicate whether the data indicated by the third information Info_3 is truncated when generating the third packet Packet_3.

The third packet Packet_3 comprises fifth information Info_5 indicating which of the data selected according to the fourth information Info_4 has the corresponding value greater than the fourth threshold value TH_4. According to an embodiment of the invention, the second threshold value TH_2 is greater than the first threshold value TH_1, and the fourth threshold value TH_4 is greater than the second threshold value TH_2.

Suppose that the fourth threshold value TH_4 is equal to 2 and the fifth threshold value TH_5 is equal to 1. Since the amount of the data indicated by the third information Info_3 is 3, which is greater than the fifth threshold value TH_5, the compression unit 120 selects one data out of the three data indicated by the third information Info_3 from the beginning of the data, that is, D[1], and compares the value of the selected data with the fourth threshold value TH_4 to generate the third packet Packet_3.

Note that in the embodiments of the invention, when being compared with the threshold values, the absolute values of the data comprised in the snippet are used. In addition, the fifth information Info_5 may be represented in a plurality of different forms. Here are some embodiments showing different representative forms of the fifth information Info_5.

In another embodiment of the invention, the fourth information Info_4 is determined only according to the fifth threshold value TH_5, wherein the fifth threshold value TH_5 may be one of several predetermined values. For example, if the fifth threshold value TH_5 is a first predetermined value, the fourth information Info_4 indicates that all of the data indicated by the third information Info_3 would be selected by the compression unit 120. On the other hand, if fifth threshold value TH_5 is a second predetermined value, the fourth information Info_4 indicates that only a part of the data indicated by the third information Info_3 would be selected by the compression unit 120 (say the first W of data indicated by the third information Info_3, where the number W is an integer). Alternatively, if the fifth threshold value TH_5 is a third predetermined value, the fourth information Info_4 indicates that only a part of the data indicated by the third information Info_3 would be selected by the compression unit 120 (say the first Z of data indicated by the third information Info_3, where the number Z is an integer different from W). In this embodiment, the third packet Packet_3 may comprise the fourth information Info_4 and the fifth information Info_5. Alternatively, the fourth information Info_4 may be predefined in both of the transmitter device 100 and the receiver device 200, so there is no need to pack the fourth information Info_4 into the third packet Packet_3.

Continuing with the first embodiment of the invention, the fifth information may directly indicate which of the data selected according to the fourth information Info_4 has the corresponding value greater than the fourth threshold value TH_4. For example, the fifth information Info_5 is {1}, where 0 represents the data with the value not greater than the fourth threshold value TH_4 and 1 represents the data with the value greater than the fourth threshold value TH_4. Note that the fifth information Info_5 may also be encoded further to reduce the data size, and the invention should not be limited thereto.

Continuing with the second embodiment of the invention, the fifth information may indicate the index of the data selected according to the fourth information Info_4 having the corresponding value greater than the fourth threshold value TH_4. For example, the fifth information Info_5 is {1}. Note that the fifth information Info_5 may also be encoded further to reduce the data size, and the invention should not be limited thereto. Note further that an indicator eob (end of block) may also be added at the end of the fifth information Info_5 to indicate that the content of the fifth information Info_5 is ended.

Continuing with the third embodiment of the invention, the fifth information may be a run length code which indicates the relative position of the data selected according to the fourth information Info_4 having the corresponding value greater than the fourth threshold value TH_4. For example, the fifth information Info_5 is {0}. Note that the fifth information Info_5 may also be encoded further to reduce the data size, and the invention should not be limited thereto. Note further that an indicator eob (end of block) may also be added at the end of the fifth information Info_5 to indicate that the content of the fifth information Info_5 is ended.

Next, the compression unit 120 may further generate a fourth packet Packet_4 comprising sixth information Info_6 indicating whether the data indicated by the first information Info_1 is greater than zero or smaller than zero. In other words, the sixth information Info_6 indicates whether each datum indicated by the first information Info_1 has a positive value or a negative value. The sixth information Info_6 may be represented in a plurality of different forms. Here are some embodiments showing different representative forms of the sixth information Info_6.

Continuing with the first embodiment of the invention, the sixth information may directly indicate whether the data indicated by the first information Info_1 is greater than zero or less than zero. For example, since the data D[1], D[6], D[7] and D[14] have positive values and the data D[4], D[8], D[11] and D[15] have negative values, the sixth information Info_6 is {0, 1, 0, 0, 1, 1, 0, 1}, where 0 represents the datum having a positive value and 1 represent the datum having a negative value.

Continuing with the second embodiment of the invention, the sixth information may indicate the index of the data indicated by the first information Info_1 having the corresponding value greater than zero (or, smaller than zero). For example, the sixth information Info_6 is {1, 6, 7, 14}. Note that the sixth information Info_6 may also be encoded further to reduce the data size, and the invention should not be limited thereto. Note further that an indicator eob (end of block) may also be added at the end of the sixth information Info_6 to indicate that the content of the sixth information Info_6 is ended.

Continuing with the third embodiment of the invention, the sixth information may be a run length code which indicates the relative position of the data indicated by the first information Info_1 having the corresponding value greater than zero (or, smaller than zero). For example, the sixth information Info_6 is {0, 1, 0, 2}. Each value in the sixth information Info_6 represents the amount of data with a negative value and indexed before a datum with a positive value. Note that the sixth information Info_6 may also be encoded further to reduce the data size, and the invention should not be limited thereto. Note further than an indicator eob (end of block) may also be added at the end of the sixth information Info_6 to indicate that the content of the sixth information Info_6 is ended.

Finally, the compression unit 120 may select data from the data indicated by the first information Info_1 according to the third information Info_3 and the fifth information Info_5, and generates a fifth packet Packet_5 comprising seventh information Info_7 indicating differences between the corresponding value of the data selected according to the third information Info_3 and the fifth information Info_5 and a sixth threshold value TH_6.

In an embodiment of the invention, the sixth threshold value TH_6 is a base value calculated based on the content of the packets Packet_1~Packet_4 and the threshold values TH1~TH5, and the sixth threshold value TH_6 (i.e. the base value) for different data may be the same or different.

For example, the compression unit 120 may select one or more data, which have the corresponding value that is unable to be determined based on the information carried in the packets Packet_1~Packet_4, from the data indicated by the first information Info_1, and calculate a base value for the selected datum or data. To be more specific, from the first information Info_1 carried in the first packet Packet_1, the values of the data D[0], D[2], D[3], D[5], D[9], D[10], D[12] and D[13] can be determined since they are equal to the first threshold TH_1. In the example as discussed above, TH_1=0. In other words, it can be concluded that the absolute values of the data D[1], D[4], D[6], D[7], D[8], D[11], D[14] and D[15] are at least 1.

From the third information Info_3 carried in the second packet Packet_2 and the sixth information Info_6 carried in the fourth packet Packet_4, since their absolute values are not greater than the second threshold value TH_2 and in the example discussed above, TH_2=1, the values of the data D[4], D[6] and D[11] can be determined as D[4]=−1, D[6]=1 and D[11]=−1. The signs of the data D[4], D[6] and D[11] can be obtained from the sixth information Info_6. In other words, it can be concluded that the absolute values of the remaining undetermined data D[1], D[7] and D[8] are at least 2.

From the fifth information Info_5 carried in the third packet Packet_3 and the sixth information Info_6 carried in the fourth packet Packet_4, none of the value of a datum can be determined and one thing can be concluded: that is the value of the data D[1] is at least 3 (since the value of the data D[1] is greater than the fourth threshold value and in the example discussed above, TH_4=2). In summary, the data having the corresponding value that is unable to be determined based on the information carried in the packets Packet_1~Packet_4 includes D[1], D[7], D[8], D[14] and D[15], where the value of the data D[1] is at least 3, the values of the data D[7] and D[8] are at least 2 and the values of the data D[14] and D[15] are at least 1.

Based on this conclusion, the compression unit 120 may determine that the base value (the sixth threshold value TH_6) for the data D[1] is 3, the base values (the sixth threshold value TH_6) for the data D[7] and D[8] are 2, and the base values (the sixth threshold value TH_6) for the data D[14] and D[15] are 1. Next, the compression unit 120 may calculate the difference between the absolute value of the data D[1], D[7], D[8], D[14] and D[15] and their corresponding base value. In this embodiment of the invention, the seventh information Info_7 is {29, 2, 0, 0, 3}. Note that the seventh information Info_7 may also be encoded further to reduce the data size, and the invention should not be limited thereto. Note further that an indicator eob (end of block) may also be added at the end of the seventh information Info_7 to indicate that the content of the seventh information Info_7 is ended.

After generating the five packets Packet_1~Packet_5, the transmitter device 100 may transmit the packets Packet_1~Packet_5 corresponding to each snippet to the receiver device 200. As discussed above, the packet transmission order may depend on the importance of the packets. For example, the most important packet of the plurality of packets corresponding to a snippet is transmitted first and the least important packet is transmitted latest. In an embodiment of the invention, the importance of the packets Packet_1~Packet_5 are distributed in a descending manner.

According to an embodiment of the invention, the threshold values TH_1~TH_5 are known by both the transmitter device 100 and the receiver device 200, and the sixth threshold value TH_6 (i.e. the base value) of the data having the corresponding value that is unable to be determined based on the information carried in the packets Packet_1~Packet_4 can be derived by both the transmitter device 100 and the receiver device 200 based on the concept illustrated above.

Based on the received packets Packet_1~Packet_5 and the corresponding threshold values TH_1~TH_6, the decompression unit 220 of the receiver device 200 may decompress the packets to obtain data comprised in the corresponding snippets.

According to an embodiment of the invention, the decompression unit 220 may first decompress the first packet Packet_1 to obtain the first information Info_1, and parses the first information Info_1 to obtain data comprised in a corresponding snippet having corresponding value not equal to the first threshold value TH_1.

Continuing with the first, second and third embodiments as illustrated above, the decompression unit 220 may derive that the values of the data D[0], D[2], D[3], D[5], D[9], D[10], D[12] and D[13] are equal to 0 and the values of the remaining data D[1], D[4], D[6], D[7], D[8], D[11], D[14] and D[15] are not equal to 0 based on the first information Info_1, where first threshold value TH_1 is equal to 0.

Next, the decompression unit 220 may further decompress the second packet Packet_2 to obtain the third information Info_3, parse the third information Info_3 to obtain data selected according to the second information Info_2 and having the corresponding value greater than the second threshold value TH_2, and determine the second information Info_2 according to the first information Info_1 and the third threshold TH_3.

Based on the third information Info_3 and the second threshold value TH_2, where second threshold value TH_2 is equal to 1, the decompression unit 220 may derive that the absolute values of the data D[4], D[6] and D[11] are equal to 1. In addition, since the amount of data indicated by the first information Info_1 is 8, which is greater than the third threshold TH_3, where the third threshold TH_3 is equal to 6, the decompression unit 220 may derive (i.e. the second information Info_2) that the data indicated by the first information Info_1 is truncated when generating the second packet Packet_2. In other words, the third information Info_3 comprises the information of only part of the data indicated by the first information Info_1.

Next, the decompression unit 220 may further decompress the third packet Packet_3 to obtain the fifth information Info_5, parse the fifth information Info_5 to obtain data selected according to the fourth information Info_4 and having the corresponding value greater than the fourth threshold value TH_4, and determine the fourth information Info_4 according to the third information Info_3 and the fifth threshold TH_5.

Based on the fifth information Info_5 and the fourth threshold value TH_4, where the fourth threshold value TH_4 is equal to 2, the decompression unit 220 may derive that the absolute values of the data D[1] is greater than 2. In addition, since the amount of data indicated by the third information Info_3 is 3, which is greater than the fifth threshold TH_5 (TH_5=1), the decompression unit 220 may derive (i.e. the fourth information Info_4) that the data indicated by the third information Info_3 is truncated when generating the third packet Packet_3. In other words, the fifth information Info_5 comprises the information of only part of the data indicated by the third information Info_3.

Next, the decompression unit 220 may further decompress the fourth packet Packet_4 to obtain the sixth information Info_6, parse the sixth information Info_6 to obtain a sign of the data indicated by the first information Info_1. Based on the sixth information Info_6, the decompression unit 220 may further determine the corresponding value of all or part of the data comprised in the corresponding snippet. For example, besides the data D[0], D[2], D[3], D[5], D[9], D[10], D[12] and D[13], which are already determined to have the value equal to 0, the decompression unit 220 may further determine that D[4]=−1, D[6]=1 and D[11]=−1 based on the sixth information Info_6.

After obtaining the packets Packet_1~Packet_4, the decompression unit 220 can determine the values of the D[0], D[2], D[3], D[4], D[5], D[6], D[9], D[10], D[11], D[12] and D[13]. The remaining data having the corresponding value that is unable to be determined based on the information carried in the packets Packet_1~Packet_4 includes D[1], D[7], D[8], D[14] and D[15]. Although the decompression unit 220 can not yet determine the values of the data D[1], D[7], D[8], D[14] and D[15], the decompression unit 220 can actually derive that the absolute value of the data D[1] is at least 3, the absolute values of the data D[7] and D[8] are at least 2 and the absolute values of the data D[14] and D[15] are at least 1 based on the information carried in the Packet_1~Packet_4 and the known threshold values. Therefore, the decompression unit 220 can derive that the base value (i.e. the sixth threshold value TH_6) for the data D[1] is 3, the base values (i.e. the sixth threshold value TH_6) for the data D[7] and D[8] are 2, and the base values (i.e. the sixth threshold value TH_6) for the data D[14] and D[15] are 1.

Next, the decompression unit 220 may further decompress the fifth packet Packet_5 to obtain seventh information Info_7, parses the seventh information Info_7 to obtain the difference between the corresponding value of remaining data comprised in the corresponding snippet and the corresponding base value, and determine the corresponding value of the remaining data according to the corresponding difference, base value and the sign.

For example, in the embodiment of the invention, since the seventh information Info_7 is {29, 2, 0, 0, 3} and the signs of the remaining data D[1], D[7], D[8], D[14] and D[15] are +, +, −, +, −, the decompression unit 220 can determine the value of the data D[1]=29+3=32, the value of the data D[7]=2+2=4, the value of the data D[8]=−(0+2)=−2, the value of the data D[14]=0+1=1 and the value of the data D[15]=−(3+1)=−4. In this manner, decompression unit 220 may retrieve the corresponding values {0, 32, 0, 0, −1, 0, 1, 4, −2, 0, 0, −1, 0, 0, 1, −4} of all data D[0]~D[15] comprised in the corresponding snippet.

According to the embodiments of the invention, the proposed data compression and decompression methods can efficiently enhance the error resilience and prevent hacking during data transmission.

The above-described embodiments of the present invention can be implemented in any of numerous ways. For example, the embodiments may be implemented using hardware, software or a combination thereof. It should be appreciated that any component or collection of components that perform the functions described above can be generically considered as one or more processors that control the discussed above function. The one or more processors can be implemented in numerous ways, such as with dedicated hardware, or with general purpose hardware that is programmed using microcode or software to perform the functions recited above.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A transmitter device, comprising:
a processing circuit, including circuitry for obtaining a branch of data and partitioning the branch of data into a plurality of snippets, wherein each snippet comprises a group of data; and
a compression circuit, comprised in the processing circuit, compressing each snippet into a plurality of packets according to value of each datum comprised in the corresponding snippet,
wherein the compression circuit compares the value of each datum with a first threshold value to generate a first packet, and the first packet comprises first information indicating which data comprised in the corresponding snippet has the corresponding value that is not equal to the first threshold value,
wherein the compression circuit further selects all or part of the data indicated by the first information according to second information, and compares the value of each datum selected according to the second information with a second threshold value to generate a second packet, the second packet comprises third information indicating which of the data selected according to the second information has the corresponding value greater than the second threshold value, and wherein the second information relates to a third threshold value,
wherein the compression circuit further selects all or part of the data indicated by the third information according to fourth information, and compares the value of each datum selected according to the fourth information with a fourth threshold value to generate a third packet, and the third packet comprises fifth information indicating which of the data selected according to the fourth information has the corresponding value greater than the fourth threshold value, and
wherein the compression circuit further generates a fourth packet comprising sixth information indicating whether the data indicated by the first information is greater than zero or smaller than zero.

2. The transmitter device as claimed in claim 1, wherein the second information indicates whether the amount of the data indicated by the first information is greater than the third threshold value.

3. The transmitter device as claimed in claim 1, wherein when the amount of the data indicated by the first information is greater than the third threshold value, the compression circuit selects the part of the data indicated by the first information, and when the data indicated by the first information is not greater than the third threshold value, the compression circuit selects all of the data indicated by the first information.

4. The transmitter device as claimed in claim 1, wherein the fourth information indicates whether the amount of the data indicated by the third information is greater than a fifth threshold value.

5. The transmitter device as claimed in claim 1, wherein when the amount of the data indicated by the third information is greater than a fifth threshold value, the compression circuit selects the part of the data indicated by the third information, and when the data indicated by the third information is not greater than the fifth threshold value, the compression circuit selects all of the data indicated by the third information.

6. The transmitter device as claimed in claim 1, wherein the compression circuit further selects data from the data indicated by the first information according to the third information and the fifth information, and generates a fifth packet comprising seventh information indicating difference between the corresponding value of the data selected according to the third information and the fifth information and a sixth threshold value.

7. The transmitter device as claimed in claim 1, further comprising an output interface transmitting the packets, wherein an order of transmitting the packets follows an order of generating the packets.

8. A receiver device, comprising:
an input interface, receiving a plurality of packets from a transmitter device; and
a decompression circuit, decompressing the packets to obtain data comprised in a plurality of snippets,
wherein the decompression circuit decompresses a first packet to obtain first information, and parses the first information to obtain data comprised in a corresponding snippet having corresponding value not equal to a first threshold value,
wherein the decompression circuit further determines second information according to the first information, decompresses a second packet to obtain third information, and parses the third information to obtain data selected according to the second information and having the corresponding value greater than a second threshold value, wherein the second information relates to a third threshold value,
wherein the decompression circuit further determines fourth information according to the third information, decompresses a third packet to obtain fifth information, and parses the fifth information to obtain data selected according to the fourth information and having the corresponding value greater than a fourth threshold value, wherein the fourth information relates to a fifth threshold value, and
wherein the decompression circuit further decompresses a fourth packet to obtain sixth information, parses the sixth information to obtain a sign of the data indicated by the first information, and determines the corresponding value of all or part of the data comprised in the corresponding snippet according to the first threshold value, the second threshold value, the fourth threshold value and the sign.

9. The receiver device as claimed in claim 8, wherein the second threshold value is greater than the first threshold value.

10. The receiver device as claimed in claim 8, wherein the fourth threshold value is greater than the second threshold value.

11. The receiver device as claimed in claim 8, wherein the second information indicates whether the amount of the data indicated by the first information is greater than the third threshold value.

12. The receiver device as claimed in claim 8, wherein the fourth information indicates whether the amount of the data indicated by the third information is greater than the fifth threshold value.

13. The receiver device as claimed in claim 8, wherein the decompression circuit further decompresses a fifth packet to obtain seventh information, parses the seventh information to obtain difference between the corresponding value of remaining data comprised in the corresponding snippet and a sixth threshold value, and determines the corresponding value of the remaining data comprised in the corresponding snippet.

14. A data compression method, comprising:
obtaining a branch of data and partitioning the branch of data into a plurality of snippets, wherein each snippet comprises a group of data; and
compressing each snippet into a plurality of packets according to value of each datum comprised in the corresponding snippet,
wherein the step of compressing each snippet further comprises:
comparing the value of each datum with a first threshold value to generate a first packet, wherein the first packet comprises first information indicating which data comprised in the corresponding snippet has the corresponding value not equal to the first threshold value;
selecting all or part of the data indicated by the first information according to second information;
comparing the value of each datum selected according to the second information with a second threshold value;
generating a second packet comprising third information, wherein the third information indicates which of the data selected according to the second information has the corresponding value greater than the second threshold value, and the second information relates to a third threshold value;
selecting all or part of the data indicated by the third information according to fourth information;
comparing the value of each datum selected according to the fourth information with a fourth threshold value;
generating a third packet comprising fifth information, wherein the fifth information indicates which of the data selected according to the fourth information has the corresponding value greater than the fourth threshold value, and the fourth information relates to a fifth threshold value; and
generating a fourth packet comprising sixth information indicating whether the data indicated by the first information is greater than zero or smaller than zero.

15. The data compression method as claimed in claim 14, wherein the second information indicates whether the amount of the data indicated by the first information is greater than the third threshold value.

16. The data compression method as claimed in claim 14, wherein the fourth information indicates whether the amount of the data indicated by the third information is greater than the fifth threshold value.

17. The data compression method as claimed in claim 14, wherein the step of compressing each snippet further comprises:
selecting data from the data indicated by the first information according to the third information and the fifth information; and
generating a fifth packet comprising seventh information indicating difference between the corresponding value of the data selected according to the third information and the fifth information and a sixth threshold value.

18. A data decompression method, comprising:
receiving a plurality of packets; and
decompressing the packets to obtain data comprised in a plurality of snippets,
wherein the step of decompressing the packets further comprises:
decompressing a first packet to obtain first information;
parsing the first information to obtain data comprised in a corresponding snippet having corresponding value not equal to a first threshold value;
determining second information according to the first information;
decompressing a second packet to obtain third information;
parsing the third information to obtain data selected according to the second information having the corresponding value greater than a second threshold value, wherein the second information relates to a third threshold value;
determining fourth information according to the third information;
decompressing a third packet to obtain fifth information;
parsing the fifth information to obtain data selected according to the fourth information having the corresponding value greater than a fourth threshold value, wherein the fourth information relates to a fifth threshold value;
decompressing a fourth packet to obtain sixth information; and
parsing the sixth information to obtain a sign of the data indicated by the first information.

19. The data decompression method as claimed in claim 18, wherein the second information indicates whether the amount of the data indicated by the first information is greater than the third threshold value.

20. The data decompression method as claimed in claim 18, wherein the fourth information indicates whether the amount of the data indicated by the third information is greater than a fifth threshold value.

21. The data decompression method as claimed in claim 18, wherein when the amount of the data indicated by the first information is greater than the third threshold value, the data selected according to the second information comprise part of the data indicated by the first information, and when the data indicated by the first information is not greater than the third threshold value, the data selected according to the second information comprise all of the data indicated by the first information.

22. The data decompression method as claimed in claim 18, wherein the second threshold value is greater than the first threshold value.

23. The data decompression method as claimed in claim 18, wherein when the amount of the data indicated by the third information is greater than the fifth threshold value, the data selected according to the fourth information comprise part of the data indicated by the third information, and when the data indicated by the third information is not greater than the fifth threshold value, the data selected according to the fourth information comprise all of the data indicated by the third information.

24. The data decompression method as claimed in claim 18, wherein the fourth threshold value is greater than the second threshold value.

25. The data decompression method as claimed in claim 18, wherein the step of decompressing the packets further comprises:
determining the corresponding value of all or part of the data comprised in the corresponding snippet according to the first threshold value, the second threshold value, the fourth threshold value and the sign;
decompressing a fifth packet to obtain seventh information;

parsing the seventh information to obtain difference between the corresponding value of remaining data comprised in the corresponding snippet and a sixth threshold value; and
determining the corresponding value of the remaining data comprised in the corresponding snippet according to the difference and the sixth threshold value.

* * * * *